(12) United States Patent
Shull et al.

(10) Patent No.: US 12,084,763 B2
(45) Date of Patent: Sep. 10, 2024

(54) MICROSTRUCTURE CONTROL OF CONDUCTING MATERIALS THROUGH SURFACE COATING OF POWDERS

(71) Applicant: Applied Materials, Inc., Santa Clara, CA (US)

(72) Inventors: Marc Shull, Los Gatos, CA (US); Peter Reimer, San Jose, CA (US); Hong P. Gao, San Jose, CA (US); Chandra V. Deshpandey, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/184,802

(22) Filed: Feb. 25, 2021

(65) Prior Publication Data

US 2022/0267899 A1    Aug. 25, 2022

(51) Int. Cl.
*C04B 35/626*    (2006.01)
*C04B 35/581*    (2006.01)
(Continued)

(52) U.S. Cl.
CPC ........ *C23C 16/4417* (2013.01); *C04B 35/581* (2013.01); *C04B 35/62685* (2013.01); *C04B 35/62805* (2013.01); *C04B 35/6281* (2013.01); *C04B 35/62815* (2013.01); *C04B 35/62884* (2013.01); *C04B 35/62894* (2013.01); *C23C 16/0227* (2013.01); *C23C 16/0272* (2013.01); *C23C 16/40* (2013.01); *C23C 16/405* (2013.01); *C23C 16/45536* (2013.01);
(Continued)

(58) Field of Classification Search
None
See application file for complete search history.

(56) References Cited

U.S. PATENT DOCUMENTS 5,489,449 A * 2/1996 Umeya .................... B22F 1/17
                                                        427/217
5,541,145 A    7/1996 Harris et al.
(Continued)

FOREIGN PATENT DOCUMENTS

CN    110451936 A  *  11/2019
TW    201720549 A      6/2017

OTHER PUBLICATIONS

Application No. PCT/US2022/016087, International Search Report and Written Opinion, Mailed On May 26, 2022, 11 pages.

*Primary Examiner* — Jose I Hernandez-Kenney
(74) *Attorney, Agent, or Firm* — Kilpatrick Townsend & Stockton LLP

(57) ABSTRACT

Exemplary deposition methods may include introducing hydrogen into a processing chamber, a powder disposed within a processing region of the processing chamber. The method may include striking a first plasma in the processing region, the first plasma including energetic hydrogen species. The method may include exposing the powder to the energetic hydrogen species in the processing region. The method may include chemically reducing the powder through a reaction of the powder with the energetic hydrogen species. The method may include removing process effluents including unreacted hydrogen from the processing region. The method may also include forming a layer of material on grains of the powder within the processing region.

11 Claims, 4 Drawing Sheets

(51) Int. Cl.
*C04B 35/628* (2006.01)
*C23C 16/02* (2006.01)
*C23C 16/40* (2006.01)
*C23C 16/44* (2006.01)
*C23C 16/442* (2006.01)
*C23C 16/455* (2006.01)
*C23C 16/505* (2006.01)
*H01L 21/687* (2006.01)

(52) U.S. Cl.
CPC ...... *C23C 16/45544* (2013.01); *C23C 16/505* (2013.01); *H01L 21/68757* (2013.01); *C04B 2235/3225* (2013.01); *C23C 16/442* (2013.01)

(56) References Cited

U.S. PATENT DOCUMENTS

| | | | |
|---|---|---|---|
| 6,613,383 B1 * | 9/2003 | George | C04B 20/1066 |
| | | | 428/404 |
| 9,399,577 B2 | 7/2016 | Tamagaki et al. | |
| 2004/0126502 A1 | 7/2004 | Ferrato et al. | |
| 2014/0356765 A1 * | 12/2014 | Pietrasz | C23C 16/45536 |
| | | | 427/535 |
| 2017/0073276 A1 * | 3/2017 | Feigelson | C04B 35/443 |
| 2017/0154701 A1 * | 6/2017 | Lee | C23C 16/4417 |
| 2017/0165791 A1 | 6/2017 | Kamachi et al. | |
| 2017/0327948 A1 * | 11/2017 | Dadheech | C23C 16/4417 |
| 2020/0027746 A1 | 1/2020 | Vervuurt et al. | |
| 2021/0308753 A1 * | 10/2021 | Larouche | B33Y 70/00 |

* cited by examiner

MICROSTRUCTURE CONTROL OF CONDUCTING MATERIALS THROUGH SURFACE COATING OF POWDERS

TECHNICAL FIELD

The present technology relates to coating processes and semiconductor chamber components. More specifically, the present technology relates to modified components and component materials.

BACKGROUND

Integrated circuits are made possible by processes which produce intricately patterned material layers on substrate surfaces. Producing patterned material on a substrate requires controlled methods of formation and removal of exposed material. Deposition and removal operations may include producing a local plasma in a processing region of a semiconductor processing chamber, for example, between a showerhead or gas distributor and a substrate support. Components of the semiconductor processing chamber may be or include a sintered composite material, as well as electrical components incorporated to provide various functionality, such as a connection to a reference ground, an electrostatic chucking voltage, or to facilitate local substrate heating. The sintered composite material, in turn, may be or include a refractory ceramic and one or more additives to impart improved electrical conductivity to the chamber component. Where the sintered material is formed by sintering a blend of two or more powders, non-uniform electrical conductivity of the sintered material may concentrate the electric field in regions of relatively high additive concentration. In such cases, the formation of non-uniform electric fields may negatively impact the performance of the plasma system, for example, by impairing electrostatic chucking, and may damage the semiconductor being processed.

Thus, there is a need for improved systems and system components that can be used to produce high quality devices and structures. These and other needs are addressed by the present technology.

SUMMARY

Exemplary deposition methods may include introducing hydrogen into a processing chamber, a powder disposed within a processing region of the processing chamber. The method may include striking a first plasma in the processing region, the first plasma including energetic hydrogen species. The method may include exposing the powder to the energetic hydrogen species in the processing region. The method may include chemically reducing the powder through a reaction of the powder with the energetic hydrogen species. The method may include removing process effluents including unreacted hydrogen from the processing region. The method may also include forming a layer of material on grains of the powder within the processing region.

In some embodiments, forming the layer of material may include exposing the powder to plasma effluents of a first precursor. Forming the layer of material may include evacuating the processing region. Forming the layer of material may also include exposing the powder to plasma effluents of a second precursor. The layer of material may be or include reaction products of the plasma effluents of the first precursor and the plasma effluents of the second precursor. The first precursor may be or include a metal and the second precursor may be or include oxygen. The powder may be or include aluminum nitride. The powder may be or include a passivation layer, and wherein chemically reducing the powder removes the passivation layer. The layer of material may be or include yttrium oxide, cerium oxide, titanium oxide, calcium oxide, or magnesium oxide. The method may further include, before forming the layer of material, forming a surface oxide layer on the grains of the powder. The layer of material may be a first layer of material, and the method may further include forming a second layer of material overlying the first layer of material. The second layer may be or include a different material than the first layer.

Some embodiments of the present technology may encompass methods of preparing a sintering mix. An exemplary method may include preparing a first coated powder characterized by a first core-shell structure. The method may include preparing a second coated powder characterized by a second core-shell structure. The second coated powder may be different from the first coated powder. The method may also include blending a sintering mix comprising the first coated powder and the second coated powder.

In some embodiments, the first core-shell structure may be or include an aluminum nitride core and at least one shell including a rare earth oxide. The second core-shell structure may be or include an aluminum nitride core and at least one shell including a transition metal oxide.

Some embodiments of the present technology may encompass sintered materials. An exemplary sintered material may be characterized by a microstructure. The microstructure may include a primary phase defining a plurality of grain boundaries. The microstructure may include a secondary phase confined to the plurality of grain boundaries. The secondary phase may comprise less than or about 3% of the sintered material by weight.

In some embodiments, the primary phase may be or include aluminum nitride. The secondary phase may be or include yttrium oxide. The sintered material may formed by sintering a coated powder. The coated powder may be characterized by a core-shell structure including an aluminum nitride core and at least one shell including a transition metal oxide or a rare earth oxide. The coated powder may be prepared by a deposition process including introducing hydrogen into a processing chamber. A powder may be disposed within a processing region of the processing chamber. The deposition process may include striking a plasma in the processing region, the first plasma comprising energetic hydrogen species. The deposition process may include exposing the powder to the energetic hydrogen species in the processing region. The deposition process may include chemically reducing the powder through a reaction of the powder with the energetic hydrogen species. The deposition process may include removing process effluents including unreacted hydrogen from the processing region. The deposition process may also include forming a layer of material on grains of the powder within the processing region. The sintered material may be configured to be incorporated into a plasma processing system as a substrate support.

Such technology may provide numerous benefits over conventional systems and techniques. For example, the methods and systems may provide a coated powder, a sintering blend, and a sintered material, exhibiting improved compatibility with plasma processing applications. For example, a powder may be chemically reduced to remove a passivation layer on the grains of the powder. In this way, a layer of material may be a coated directly onto a powder, for example, by atomic layer deposition. By sintering one or more coated powders, a sintering blend may permit the forming of a sintered material with tailored electrical properties. As such, the sintered material may exhibit improved electrical properties at elevated temperatures, including temperatures at which semiconductor processing operations are undertaken. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
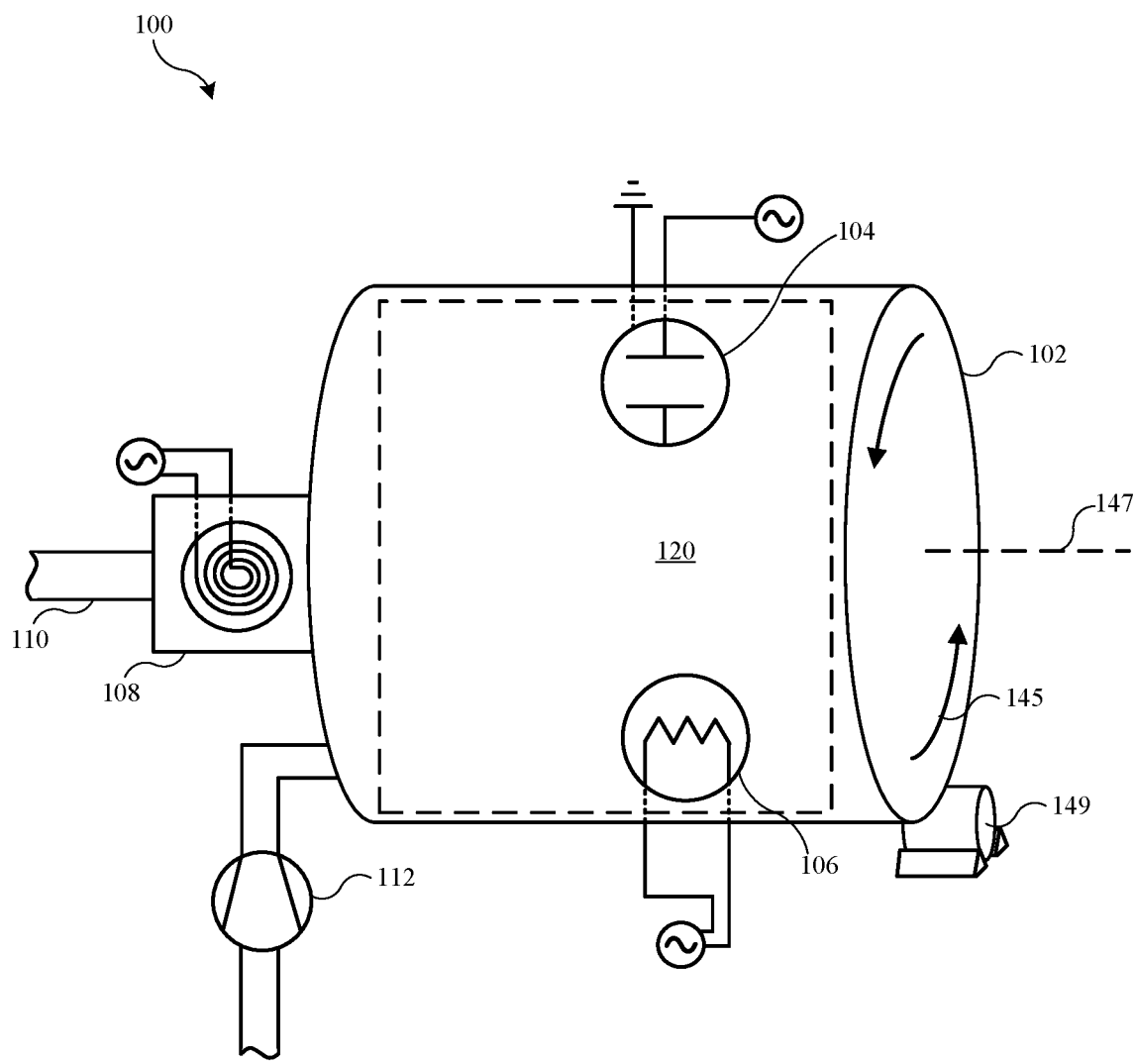
FIG. 1 shows a schematic view of an exemplary processing chamber according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

As part of semiconductor processing technology, deposition and removal operations may include producing a local plasma in a processing region of a semiconductor processing chamber, for example, between a showerhead or gas distributor and a substrate support. Components of the semiconductor processing chamber may be or include a sintered composite material, as well as electrical components incorporated to provide various functionality, such as a connection to a reference ground, an electrostatic chucking voltage, or to facilitate local substrate heating. The sintered composite material, in turn, may be or include a refractory ceramic and one or more additives to impart improved electrical conductivity to the chamber component. Where the sintered material is formed by sintering a mix of two or more different powders, with a first being the refractory ceramic and a second being the additive, grain segregation may occur in the composite material, leading to the formation of electrically conductive grain inclusions in the microstructure of the sintered composite material. Under plasma operating conditions, for example, at temperatures used in deposition processes, electron conduction through the sintered composite material may occur preferentially through the grain inclusions. Preferential conduction through grains may concentrate electric fields in regions of high additive concentration. In such cases, the impact of preferential conduction may negatively impact the performance of the plasma system, and may damage the semiconductor substrate being processed. For example, non-uniformity in the electric field near the substrate holder may reduce the effectiveness of an electrostatic chucking system configured to retain the substrate on the substrate holder.

Conventional technology has approached this limitation by controlling plasma operating conditions, for example, operating pressure, plasma power, duty cycle, or pulse frequency, which may restrict the operational window. The present technology may overcome these limitations by implementing improved deposition methods to remove a native passivation layer from the grains of the powder, which may permit deposition of materials directly onto the grains of the powder, for example, by atomic layer deposition. In addition, by sintering a coated powder, the distribution of conductive additive may be uniformly distributed through a sintered material, and may thereby reduce the formation of conductive grain inclusions. This may enable preparation of coated powders for fabricating a variety of improved sintered materials, including, but not limited to, plasma processing chamber components that exhibit improved electrical properties at temperatures used in semiconductor processing. As a result, sintered materials may be implemented in electrostatic chucking applications, such as Coulombic chucking and Johnsen-Rahbek chucking.

After describing general aspects of a chamber according to embodiments of the present technology in which plasma processing may be performed, specific methodology and component configurations may be discussed. It is to be understood that the present technology is not intended to be limited to the specific films and processing discussed, as the techniques described may be used to improve a number of film formation processes, and may be applicable to a variety of processing chambers and operations.

FIG. 1 shows a schematic view of an exemplary processing chamber 100 according to some embodiments of the present technology. The figure may illustrate an overview of a system incorporating one or more aspects of the present technology, and/or which may perform one or more operations according to embodiments of the present technology. Additional details of chamber 100 or methods performed may be described further below. Chamber 100 may be utilized to form coated powders according to some embodiments of the present technology, although it is to be understood that the methods may similarly be performed in any chamber within which film formation may occur. For example, while the chamber 100 is illustrated in a horizontal rotating configuration, alternative embodiments may include a fluidized bed configuration or a plasma powder synthesis system. The processing chamber 100 may include a chamber body 102, a plasma system 104 inside the chamber body 102, a temperature control system 106, and a remote plasma system 108 coupled with the chamber body 102 and configured to provide plasma effluents to a processing region 120 of the chamber body 102.

A powder may be provided to the processing region 120 through a material feedthrough, such as a port or conduit, which may be sealed for processing using a slit valve, gate valve, or door. The powder may be mechanically mixed during processing. To that end, the processing region 120 or the chamber body 102 may be rotatable, as indicated by the arrow 145, about an axis 147, for example, by an electromechanical rotating element 149 configured to rotate one or more structures internal to the chamber body 102, for example, by rotating the chamber body 102 about the axis 147. Alternatively, the powder may be mixed and suspended in the processing region 120 by convective action of gases introduced during a deposition process, for example, by fluidization that may be controlled to limit entrainment and powder loss.

Precursors, as described below, may be provided to the chamber 100 through a gas supply system 110. While FIG. 1 illustrates a single inlet for the gas supply system 110, the chamber 100 may include multiple gas inlets coupled with the chamber body 102 at one or more locations. For example, a plasma precursor may be introduced to the chamber body through the remote plasma system 108, while a second gas inlet may provide gases for which plasma dissociation would negatively impact the deposition process. Gases may be removed from the chamber body 102 by a gas removal system 112. The gas removal system may include a vacuum system, configured to facilitate reduced pressure operation during deposition processes and to evacuate the chamber to remove process effluents and unreacted process gases. Measurement and control systems may be coupled with the chamber to measure operating pressure in one or more places, such as in the gas supply system 110, the gas removal system 112, or in the processing region 120. In another example, the temperature control system 106 may include temperature sensors and a heating element configured to provide heat to the processing region 120 or to remove heat from the processing region 120. In this way, the chamber 100 may implement controlled deposition and removal processes, such as plasma etching and removal, and atomic layer deposition.

As part of implementing plasma processing of powders in the chamber 100, in accordance with the methods described below, the plasma system 104 may be configured to form a plasma within the processing region 120. The plasma system 104 may be or include an indirect plasma system, such as an RF capacitively-coupled plasma, configured to form a plasma within the processing region 120 by generating sufficiently strong electric fields internal to the chamber body 102. In some embodiments, the plasma system 104 may be or include a direct plasma system, such that one or more electrode surfaces are disposed within the chamber body. In this way, the processing region 120 may be defined between a live electrode and a reference ground electrode of the plasma system 104. The plasma system 104 may also include control systems and power supply systems, such as impedance matching circuits and 13.56 MHz RF power supplies.

Similarly, the remote plasma system 108 may be or include a direct plasma system or an indirect plasma system, such as an inductively coupled RF plasma system or a capacitively coupled RF plasma system, which may be configured to decompose a precursor into plasma effluents that can be provided to the processing region 120. For example, the gas supply system 110 may include a quartz inlet tube coupled with a feedthrough to the chamber body 102. In such an arrangement, the remote plasma system 108 may be or include an ICP or a CCP system disposed external to the quartz inlet tube and configured to form a plasma within the quartz inlet tube. As described in reference to FIG. 2, the precursor may include an inert carrier gas and a reaction precursor that may be or include a vapor or a gas. In this way, the remote plasma system 108 may form an indirect plasma in the precursor and may decompose the precursor. The decomposed precursor may be or include plasma effluents, which may be or include carrier gas, unreacted precursor, and plasma generated species. The plasma generated species may serve as reactants in a chemical reaction mediated deposition process, such as atomic layer deposition. As with the plasma system 104, remote plasma system 108 may also include control systems and power supply systems, such as impedance matching circuits and 13.56 MHz RF power supplies.

The temperature control system 106 may be configured to maintain an internal temperature in the processing region in accordance with a processing method. For example, as part of atomic layer deposition, a deposition substrate, such as a powder, may be heated to a reaction temperature at which a particular reaction product is favored. In an illustrative example, a surface reaction that forms a layer of material on the deposition substrate may be thermodynamically favored at an elevated temperature. As such, the temperature control system 106 may provide heat to the processing region. In some embodiments, the temperature control system may at least partially integrated into the plasma system 104. For example, an electrode of the plasma system 104 may incorporate heating and/or cooling elements, permitting the plasma system to operate within a range of operating temperatures.

In some embodiments, the chamber 100 may be configured to prepare coated powders for which the grains of the powder are coated with one or more layers of material. As described in reference to methods and systems, below, the chamber 100 may permit the preparation of improved coated ceramic powders, which may be incorporated into sintering blends and sintered materials. Such sintered materials may exhibit improved electrical properties at elevated temperatures that are characteristic of plasma deposition and removal operations as part of semiconductor processing.

Figure 2:
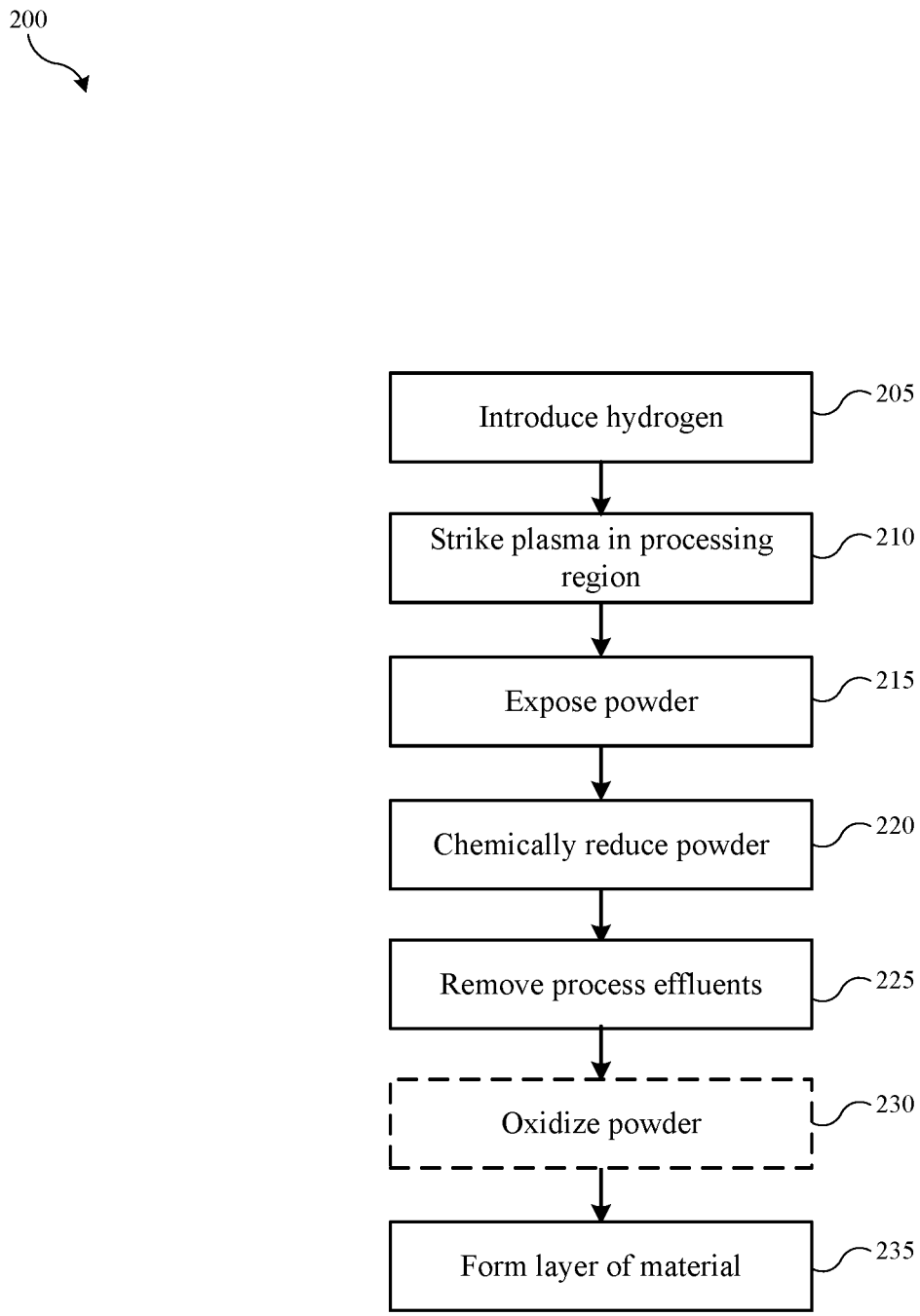
FIG. 2 shows exemplary operations in a deposition method according to some embodiments of the present technology.

FIG. 2 shows exemplary operations in a deposition method 200 according to some embodiments of the present technology. The method may be performed in a variety of processing chambers, including processing chamber 100 described above. Method 200 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated.

Method 200 may include additional operations prior to initiation of the listed operations. For example, additional processing operations may include preparing a powder, for example, by ball milling a material feedstock to prepare a powder of a characteristic size. Method 200 may optionally include delivering a powder to a processing region of a processing chamber, such as processing chamber 100 described above, or other chambers that may include components as described above. Method 200 describes operations shown schematically in FIG. 3, the illustrations of which will be described in conjunction with the operations of method 200. FIG. 4 illustrates an exemplary semiconductor processing system incorporating materials produced according to some embodiments of the method 200. It is to be understood that FIGS. 3-4 illustrate only partial schematic views, and a processing system may include subsystems as illustrated in the figures, as well as alternative subsystems, of any size or configuration that may still benefit from aspects of the present technology.

Figure 3:
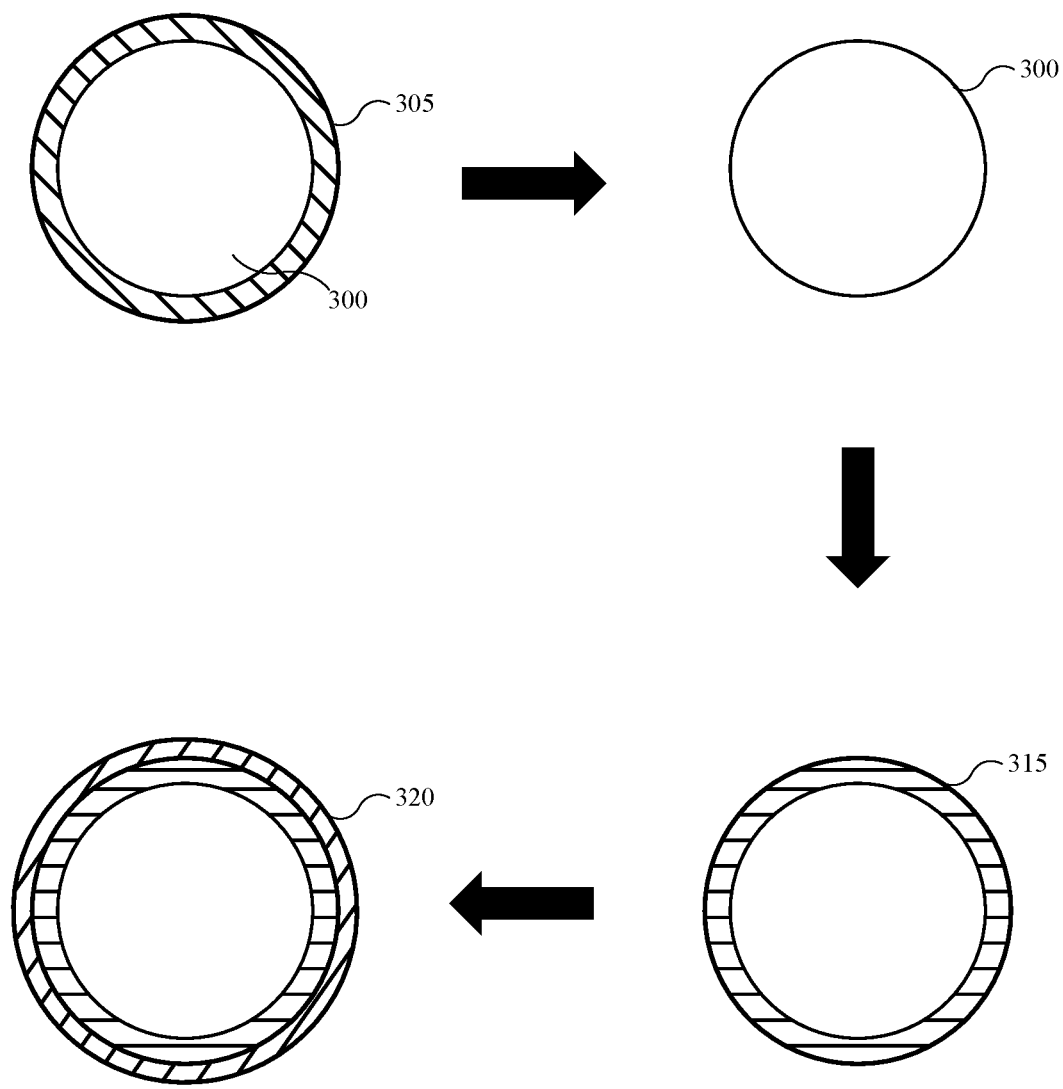
FIG. 3 show schematic views of a powder during operations in a deposition method according to some embodiments of the present technology.
Figure 4:
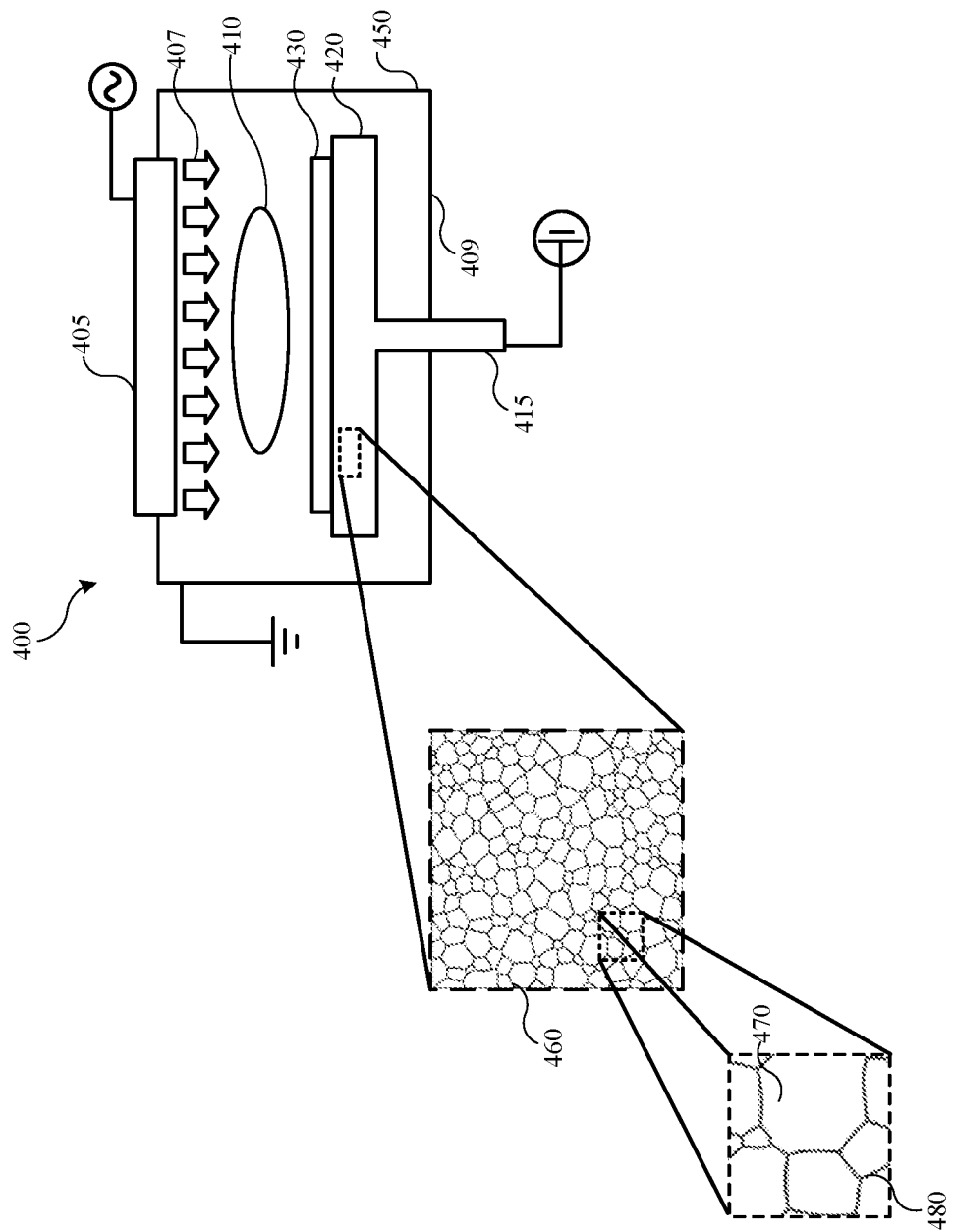
FIG. 4 show schematic views of an exemplary processing chamber component formed the method according to some embodiments of the present technology.

FIG. 3 show schematic views of a powder 300 during operations of the deposition method 200 according to some embodiments of the present technology. In some embodiments, the method 200 may include one or more operations preceding those illustrated in FIG. 2. For example, one or more processes may be implemented to form the powder 300 from a feedstock material For example, the powder 300 may be formed by chemically converting an oxide to a nitride, and may be cleaned, for example, by baking, etching, or degreasing. Examples of nitride synthesis may include, but are not limited to, carbo-thermal nitridization and/or direct nitridization. Furthermore, the powder 300 may be introduced into a processing chamber, such as the chamber 100, bearing a passivation layer 305. For example, the powder 300 may be or include aluminum nitride, which, through exposure to oxygen during cleaning or through exposure to air at ambient conditions, may develop an oxide passivation layer.]

At operation 205, as illustrated in FIG. 3A, the method 200 may include introducing hydrogen to the processing region of the chamber. Hydrogen may permit a hydrogen plasma, a hydrogen-rich plasma, or a trace-hydrogen plasma to be formed in the processing region, as an approach to chemically reducing the passivation layer 305. For example, operation 205 may precede hydrogen reduction of the passivation layer, as an approach to providing improved control of surface material properties of the powder 300. A flowrate of hydrogen introduced to the chamber may depend at least in part on one or more parameters of the chamber, the powder 300, or the method 200. For example, where the flowrate may be such that a plasma may form with a sufficient energy density or species density, such as ions, free electrons, or activated hydrogen, to facilitate hydrogen reduction of the passivation layer 305. In contrast, the flowrate of hydrogen may be limited by entrainment of the powder 300 in the flow, which may occur when the flowrate is excessively high. In such cases, the hydrogen may entrain the powder 300 and carry it out of the processing region, which is to be avoided.

In some embodiments, the precursor 307 may be or include hydrogen provided to the processing region at a flowrate greater than or about 0.1 SLM, greater than or about 0.2 SLM, greater than or about 0.3 SLM, greater than or about 0.4 SLM, greater than or about 0.5 SLM, greater than or about 1 SLM, greater than or about 1.5 SLM, greater than or about 2 SLM, greater than or about 2.5 SLM, greater than or about 3 SLM, greater than or about 3.5 SLM, greater than or about 4 SLM, greater than or about 4.5 SLM, greater than or about 5 SLM, greater than or about 5.5 SLM, greater than or about 6 SLM, greater than or about 6.5 SLM, greater than or about 7 SLM, greater than or about 7.5 SLM, greater than or about 8 SLM, greater than or about 8.5 SLM, greater than or about 9 SLM, greater than or about 9.5 SLM, greater than or about 10 SLM, or greater.

In some embodiments, the hydrogen may include an inert carrier gas. In plasma systems, inert carrier gases, also referred to as "forming gases" facilitate plasma ignition and control of plasma conditions. For example, providing the hydrogen with a given inert gas fraction may permit the plasma to operate under controlled plasma conditions, such as ionization fraction, ion temperature, or electron temperature. As such, the precursor 307 may be or include helium or argon, provided to the processing region at a flowrate greater than or about 0.1 SLM, greater than or about 0.2 SLM, greater than or about 0.3 SLM, greater than or about 0.4 SLM, greater than or about 0.5 SLM, greater than or about 1 SLM, greater than or about 1.5 SLM, greater than or about 2 SLM, greater than or about 2.5 SLM, greater than or about 3 SLM, greater than or about 3.5 SLM, greater than or about 4 SLM, greater than or about 4.5 SLM, greater than or about 5 SLM, greater than or about 5.5 SLM, greater than or about 6 SLM, greater than or about 6.5 SLM, greater than or about 7 SLM, greater than or about 7.5 SLM, greater than or about 8 SLM, greater than or about 8.5 SLM, greater than or about 9 SLM, greater than or about 9.5 SLM, greater than or about 10 SLM, greater than or about 10.5 SLM, greater than or about 11 SLM, greater than or about 11.5 SLM, greater than or about 12 SLM, greater than or about 12.5 SLM, greater than or about 13 SLM, greater than or about 13.5 SLM, greater than or about 14 SLM, greater than or about 14.5 SLM, greater than or about 15 SLM, or greater.

Subsequent introducing hydrogen into the processing region, the method 200 may include striking a plasma in the processing region at operation 210. The plasma may be or include a hydrogen plasma, and as such it may include energetic plasma species, such as hydrogen ions, hydrogen radicals, or metastable diatomic hydrogen. The hydrogen plasma may be formed in the processing region while the powder 300 is suspended in the processing region or passes through the processing region. The plasma treatment may be performed based on hydrogen supplied with a carrier gas, such as argon or helium, for generating the plasma, and the hydrogen may constitute a percentage material in the gas mixture. For example, in some embodiments the plasma may be generated from a gas mixture of which hydrogen is included at greater than or about 0.5%, and may be included at greater than or about 1.0%, greater than or about 1.0%, greater than or about 1.0%, greater than or about 1.0%, greater than or about 1.0%, greater than or about 1.0%, greater than or about 1.0%, greater than or about 1.0%, greater than or about 1.0%, or more, although in some embodiments the hydrogen concentration may be maintained at less than or about 20%, less than or about 10%, or less, to limit the amount of reducing agents produced. A pressure within the processing chamber during the treatment may be maintained at less than or about 10 Torr, and may be maintained at less than or about 8 Torr, less than or about 6 Torr, less than or about 5 Torr, less than or about 4 Torr, less than or about 3 Torr, less than or about 2.5 Torr, less than or about 2.0 Torr, less than or about 1.5 Torr, less than or about 1.0 Torr, less than or about 0.5 Torr, or less. In some embodiments, the chamber may be pre-coated prior to the plasma treatment, which may minimize the opportunity for contamination of the materials due to hydrogen etching or reduction.

As described in reference to FIG. 1, suspending the powder 300 may include rotating a chamber body of the deposition system, such as chamber body 102 of FIG. 1, to repeatedly pass the powder 300 through the processing region and the hydrogen plasma. In some cases, the powder 300 may be suspended by controlled gas flow to form a fluidized bed. In this way, Subsequent striking the plasma, the method 200 may include exposing the powder 300 to the hydrogen plasma at operation 215. By exposing the powder 300 to the hydrogen plasma, the passivation layer 305 may react with the energetic plasma species present in the hydrogen plasma. As such, concurrent with exposing the powder 300 to the plasma, the method 200 may include chemically reducing the powder 300 and/or the passivation layer 305 at operation 220. The passivation layer 305, which may be or include metal oxide, may react with the hydrogen plasma to produce metal and water vapor. As such, the reduction reaction may preferentially remove the passivation layer 305, such that the powder 300 may serve as a substrate for subsequent deposition of material layers. For example, the powder 300 may be or include aluminum nitride, and the passivation layer 305 may be or include aluminum oxide. In this example, chemically reducing the powder may include reacting the aluminum oxide with energetic hydrogen species to form water vapor and aluminum that may remain on the surface of the powder 300 subsequent removal of the passivation layer 305. To that end, the hydrogen plasma may also include nitrogen, which may permit the aluminum to be exposed to energetic nitrogen species to convert residual aluminum to aluminum nitride on the surface of the powder 300.

Subsequent chemically reducing the powder 300, the method 200 may include removing process effluents from the processing region at operation 225. The process effluents may be or include unreacted hydrogen or water vapor, among other plasma reaction products. As water vapor and hydrogen may inhibit the formation of material layers by atomic layer deposition, the residual gases remaining after the plasma-removal of the passivation layer 305 may be removed, for example, by the gas removal system 112 of FIG. 1. To limit loss of the powder 300, the operations undertaken to pass the powder 300 through the processing region or to suspend the powder in the processing region may stop prior to operation 225. Removing process effluents may also include introducing an inert purge gas into the processing chamber to exchange the gases. In some embodiments, the powder may be heated, such as by the temperature control system 106, while the chamber is maintained under vacuum, in order to degas the powder.

In some embodiments, method 200 may optionally include oxidizing the powder 300 at operation 230. Operation 230 may therefore include introducing oxygen into the processing region of the chamber. Introducing oxygen into the processing region as part of plasma enhanced deposition may permit the formation of a controlled oxide layer on the powder 300. In contrast to the passivation layer 305, the controlled oxide layer may be formed under controlled conditions, such as in an oxygen plasma in the processing region, such that an oxide layer may be formed on the powder with a characteristic and uniform thickness. Additionally or alternatively, operation 230 may include thermal oxidation of the powder 300 subsequent removal of the passivation film 305. A surface oxide layer may impart improved control of electronic properties in a sintered material formed using the powder 300, for example, by acting as a diffusion barrier or by defining grain boundaries in the sintered material. In this way, it may be advantageous to reduce the powder 300 to remove the passivation layer 305, and subsequently to oxidize the powder 300 under controlled conditions to reform an oxide layer.

Subsequent oxidizing the powder 300, method 200 may include forming a layer of material 315 on the powder 300 at operation 235. In some embodiments, forming the layer of material 315 on the powder 300 may include undertaking operations of an atomic layer deposition (ALD) process, whereby the grains of the powder 300 are uniformly coated. For example, operation 235 may include introducing plasma effluents to the processing region. Plasma effluents may be or include plasma generated species that are formed by a remote plasma system, such as remote plasma system 108 of FIG. 1, in communication with the processing region. Introducing the plasma effluents may include introducing a carrier gas including the plasma effluents. In this way, introducing the plasma effluents into the processing region may expose the powder 300 to plasma effluents of one or more precursors that have been subjected to plasma decomposition. Plasma effluents, therefore, may be or include ions, activated radicals, metastable species, and other decomposition products, and may be characterized by average energy distribution lower than that of a direct plasma system. Exposing the powder 300 to the plasma effluents may, in turn, result in the formation of an adsorbed monolayer of plasma effluents on the surface of the grains of the powder 300 that serves as a precursor to the formation of the layer of material 315. In a second operation of atomic layer deposition, operation 235 may include removing the plasma effluents by purging the processing region of gas, while retaining the powder 300 bearing the adsorbed monolayer. Purging the processing region may be implemented using a gas removal system, such as the gas removal system 112 of FIG. 1. Subsequent purging, a second precursor may be decomposed into second plasma effluents, such that the powder 300 is exposed to the second plasma effluents. The second precursor may be chosen such that it decomposes into plasma generates species that react with the monolayer adsorbed on the powder 300 to form the layer of material 315. Subsequent forming the layer of material 315, the unreacted plasma effluents and reaction byproducts may be removed by the gas removal system.

In some embodiments, the first and second precursors may be selected such that the layer of material 315 may be or include a conductive additive to improve the electrical conductivity of a sintered material formed by sintering the powder 300. In this way, one precursor may be or include a metal and the other precursor may be or include oxygen. The metal may be or include a rare earth element or a transition metal. For example, the first precursor may be or include yttrium, cerium, titanium, calcium, or magnesium and the layer of material 315 may be or include an oxide, such as yttrium oxide, cerium oxide, titanium oxide, calcium oxide, or magnesium oxide.

In some embodiments, the constituent operations of the operation 235 may be repeated to deposit multiple monolayers, such that the layer of material 315 may be formed on a monolayer-by-monolayer basis, and the thickness of the layer of material 315 may be an integer multiple of the monolayer thickness and the number of repetitions of the operation 235. Furthermore, following the operation 235, a second layer of material 320 may be formed overlying the layer of material 315, by repeating the operation 235 with a different set of first and second precursors. For example, where the layer of material 315 may be or include yttrium oxide, the second material 320 may be or include a different oxide, such as titanium oxide, magnesium oxide, or another transition metal oxide or rare earth oxide. As such, a coated powder formed from the powder 300 by the method 200 may include a controlled oxide layer, the layer of material 315, and one or more additional layers of different materials, such as the second layer of material 320.

As such, the method 200 and its constituent operations may provide one or more improvements to plasma enhanced deposition processes for depositing materials layers onto a powder by ALD. For example, the method 200 may provide a coated powder characterized by a core shell structure, where the core may be or include a ceramic material, such as aluminum nitride, with one or more shells, such as a transition metal oxide or a rare earth oxide. The shells may be precisely deposited, due to the layer-wise deposition of atomic layer deposition methods, such that the relative composition of the coated powder may be specified by repeating the operation 235 for a predetermined number of times. Furthermore, plasma removal of a native passivation layer improves control of surface chemistry and therefore improves the electrical properties of sintered materials formed using coated powders.

As described below, the coated powder may be prepared to provide improved electrical properties to a material formed by sintering the coated powder. To that end, the method 200 may be implemented to prepare multiple coated powders, to be combined into a sintering mix. For example, a first coated powder may be or include an aluminum nitride powder coated by a layer of yttrium oxide. A second coated powder may be or include an aluminum nitride powder coated by a layer of titanium oxide. The sintering mix may then be prepared by blending the first coated powder and the second coated powder, such that a sintered material formed using the sintering mix may be characterized by improved electrical properties, due in part to the improved control of relative composition of the coating material and in part to the improved distribution of the coating material in the sintering mix. Distribution of the coating material may be improved, in particular, relative to bulk powder blends that may undergo agglomeration or density segregation, as examples of phenomena that may limit the effectiveness of blending and negatively impact the material properties of sintered materials.

FIG. 4 show schematic views of an exemplary plasma processing system including one or more components formed by the method according to some embodiments of the present technology. FIG. 4 further illustrates details relating to a semiconductor processing system 400, and one or more components that may be incorporated into system 400 that may be or include a sintered material. The sintered material, in turn, may be formed by sintering a coated powder, such as the coated powder prepared by the method 200. System 400 is understood to include any feature or aspect of a semiconductor processing chamber, and may be used to perform semiconductor processing operations including deposition, removal, and cleaning operations. System 400 may show a partial view of the chamber components being discussed and that may be incorporated in a typical semiconductor processing system, and may illustrate a view across a center of the pedestal and gas distributor, which may otherwise be of any size. Any aspect of system 400 may also be incorporated with other processing chambers or systems as will be readily understood by the skilled artisan.

System 400 may include a semiconductor processing chamber 450 including a showerhead 405, through which precursors 407 may be delivered for processing, and which may be configured to form a plasma 410 in a processing region between the showerhead 405 and a pedestal or substrate support 415. The showerhead 405 is shown at least partially internal to the chamber 450, and may be understood to be electrically isolated from the chamber 450. In this way, the showerhead 405 may act as a live electrode or as a reference ground electrode of a direct plasma system to expose a substrate held on the substrate support 415 to plasma generated species. The substrate support 415 may extend through the base of the chamber 450. The substrate support 415 may include a support platen 420, which may hold a semiconductor substrate 430 during deposition or removal processes used to form patterned structures on the semiconductor substrate 430.

The support platen 420 may be or include a sintered material formed from coated powder prepared in accordance with embodiments of method 200. The support platen 420 may incorporate embedded electrodes to provide the electrostatic field employed to hold the semiconductor substrate, and may also include a thermal control system that may facilitate processing operations including, but not limited to, deposition, etching, annealing, or desorption. In some embodiments, the support platen 420 may incorporate a plate, a perforated plate, a mesh, a wire screen, or any other distributed arrangement of conductive elements. The embedded electrodes may be or include a tuning electrode to provide further control over the plasma 410, for example, by adjusting an electric field near the surface of the support platen. Similarly, a bias electrode and/or an electrostatic chucking electrode, may be coupled with the support platen 420. The bias electrode may be coupled with a source of electric power, such as a DC power, pulsed DC power, RF bias power, a pulsed RF source or bias power, or a combination of these or other power sources. In this way, the substrate support 415 and the support platen 420 may be used during plasma processing operations not only to hold the semiconductor substrate 430, but also to tune the conditions of the plasma 410. Tuning the conditions of the plasma may include implementing automatic impedance matching to maintain plasma conditions during plasma processing operations, for example, while the composition of the plasma 410 is varied or as the surface of the semiconductor substrate 430 changes, for example, due to deposition of dielectric films onto electrode surfaces. In this way, precise control of the plasma 410 may depend on the material properties of the substrate support 415 and the support platen 420.

For example, a potential difference may be established between the plasma 410 and the showerhead 405. A potential difference may also be established between the plasma 410 and the support platen 420. Power supplies in communication with the respective conducting surfaces may then be used to adjust the flow properties of the ground paths, for example, by employing impedance matching ballast circuits. Impedance matching circuits may be or include variable capacitors. As such, the matching circuits may adjust the variable capacitors to maximize deposition rate and minimize thickness non-uniformity independently during semiconductor deposition processes, as when the system 400 includes independent control circuits for the showerhead 405 and the support platen 420. That being said, the effectiveness of the control circuits to maintain the plasma 410 about a set point may be inhibited by thermal dependence of electrical conductivity of the components of the chamber 450 and by electric field dynamics caused by non-uniform conduction in the chamber components.

In some cases, the support platen 420 or other chamber components may be formed from a sintered material. For example, a powder may be pressed into a mold and heated until grains of the powder fuse into the sintered material. Subsequent operations, such as annealing, machining, incorporating electrical components, and applying protective surface coatings, may be applied to finish the component, providing a working component that can be incorporated in a plasma system. An advantage of using a sintered material may include that a finished component may serve as a refractory conductor, with favorable thermal deformation characteristics and chemical resistance to plasma etching, as well as electrical conductivity. One drawback, however, is that the electrical conductivity of a sintered component may increase with temperature. Furthermore, the electrical conductivity may increase non-uniformly with temperature, arising from characteristics of a microstructure of the sintered material.

At temperatures below a transition temperature, electrical conductivity of the sintered material may be governed by a grain-boundary conduction mechanism, under which electron current is confined to grain boundaries between grains of the microstructure. Above the transition temperature, however, conductive grain inclusions in the microstructure of the sintered material may cause conduction to shift to a grain-conduction mechanism, under which electron current flows through the conductive grain inclusions rather than through the grain boundaries, inducing a decrease in the resistivity of the sintered material and a decrease in surface charge. Where the conductive grain inclusions are distributed non-uniformly in the sintered material, conduction may occur preferentially at regions of high inclusion density and, as such, electric field density may concentrate in places on the support platen 420, which may reduce the effectiveness of an electrostatic chuck included in the support platen 420. In some embodiments, the transition may occur at temperatures in a range of 400-600° C., at which point a chucking voltage may increase with temperature, up to a point where the electrostatic chucking system may be unable to provide charge for maintaining chucking force and for holding the substrate on the surface.

Advantageously, sintered material formed from a coated powder prepared by the operations of the method 200, as described in reference to FIG. 2, may exhibit improved electrical properties at temperatures employed for plasma processing operations. For example, where a conventional sintered material may be formed from a blend of powders including a ceramic and a conductive additive, such as a metal oxide or a rare earth oxide, the distribution of conductive additive may depend on blending efficiency and the sintering of additive powder grains may lead to segregation of oxide grains in the microstructure of the sintered material. In this way, the resulting sintered material may include conductive grain inclusions that impair the electrical properties of the material at process temperatures. For example, in a sintering mix including aluminum nitride powder and yttrium oxide powder, sintering may form yttrium aluminum oxide grain inclusions in the microstructure of the sintered material. Yttrium aluminum oxide may exhibit temperature dependent electrical conductivity that may induce the transition to a grain-conduction mechanism above the transition temperature for the sintered material.

In contrast, sintering the coated powders described in reference to FIG. 3, having one or more shells formed by the operations of the method 200, may result in an improved microstructure 460. By forming the sintered material with the coated powder, the core-shell structure may serve to control the distribution of the conductive additive. The controlled distribution, in turn, may limit the migration of the conductive additive during sintering, and may produce two principle phases in the microstructure 460. The microstructure 460 may include a primary phase 470 and a secondary phase 480, but may be substantially free of conductive grain inclusions. For example, the primary phase 470 may define a three-dimensional network of grain boundaries, and the secondary phase 480 may be confined to the grain boundaries. The primary phase 470 may be or include a ceramic material, such as that of the powder 300 of FIG. 3. For example, the primary phase 470 may be or include aluminum nitride. The secondary phase 480 may be or include the material of the layers formed at operation 235 of FIG. 2 that has reacted with material of the powder core to form an alloy oxide. For example, where the core of the coated powder is aluminum nitride and the shell includes yttrium oxide, the secondary phase 480 may be or include yttrium aluminum oxide.

Advantageously, where the microstructure 460 confines the secondary phase 480 to the grain boundaries between grains of the primary phase 470, the sintered material may be prevented from transition to the grain-conduction mechanism at process temperatures. In this way, maintaining a grain-boundary conduction mechanism may provide improved electrical performance of components formed from the sintered material, without significant reduction in other material properties, such as resistance to etching and oxidation, limited thermal deformation, or refractory properties. Consequently, control and uniformity of the electric field emanated by the support platen 420 may be improved during semiconductor processing operations, thereby reducing the effect on electrostatic chucking force that is caused by grain-conduction.

Advantageously, forming the sintered material from the coated powder may permit the composition of the sintered material to be precisely controlled. In materials formed by sintering a blend of two powders, the composition may depend on precise measurement and handling of the blend prior to sintering. In contrast, a coated powder may be formed to have a precise composition, due in part to the precise nature of ALD techniques that form single layers of a coating material for each deposition cycle. In this way, each grain of the coated powder may include a precise quantity of a conductive additive on the surface, providing a sintered material with a controlled composition that may be selected to impart improved electrical properties to the sintered materials.

The microstructure 460 may be characterized by an average grain size that may influence the electrical properties of the sintered material, where the grain size may correspond to the relative fraction of the primary phase 470 or the size of the powder grains used to form the sintered material. For example, a relatively high concentrations of the primary phase 470, where the primary phase 470 is characterized by low electrical conductivity, may limit the influence of the secondary phase 480 on the electrical conductivity of the sintered material. Furthermore, relatively high concentrations of secondary phase may permit phase migration and formation of conductive inclusions during sintering.

In some embodiments, the coated particle may be formed with a shell including the conductive additive, such that the sintered material includes less than or about 15% by weight, less than or about 14% by weight, less than or about 13% by weight, less than or about 12% by weight, less than or about 10% by weight, less than or about 9% by weight, less than or about 8% by weight, less than or about 7% by weight, less than or about 6% by weight, less than or about 5% by weight, less than or about 4% by weight, less than or about 3% by weight, less than or about 2% by weight, less than or about 1% by weight, less than or about 0.5% by weight, or less, of the secondary phase 480.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A deposition method, comprising:
   introducing hydrogen into a processing chamber, a powder disposed within a processing region of the processing chamber, and wherein the powder comprises a passivation layer;
   striking a first plasma in the processing region, the first plasma comprising energetic hydrogen species;
   exposing the powder to the energetic hydrogen species in the processing region;
   chemically reducing the powder through a reaction of the powder with the energetic hydrogen species, wherein chemically reducing the powder removes the passivation layer;
   removing process effluents including unreacted hydrogen from the processing region;
   forming a first layer of material on grains of the powder within the processing region, wherein the first layer of material comprises yttrium oxide, cerium oxide, titanium oxide, calcium oxide, or magnesium oxide; and
   forming a second layer of material overlying the first layer of material, wherein the second layer of material comprises a different material than the first layer of material, and wherein the second layer of material comprises yttrium oxide, cerium oxide, titanium oxide, calcium oxide, or magnesium oxide.

2. The deposition method of claim 1, wherein forming the first layer of material and the second layer of material comprises:
   exposing the powder to plasma effluents of a first precursor;
   evacuating the processing region; and
   exposing the powder to plasma effluents of a second precursor, wherein the first layer of material and the second layer of material comprises reaction products of the plasma effluents of the first precursor and the plasma effluents of the second precursor.

3. The deposition method of claim 2, wherein the first precursor comprises a metal and the second precursor comprises oxygen.

4. The deposition method of claim 1, wherein the powder comprises aluminum nitride.

5. The deposition method of claim 1, further comprising:
   before forming the first layer of material, forming a surface oxide layer on the grains of the powder.

6. The deposition method of claim 1, wherein:
   the first layer of material comprises yttrium oxide; and
   the second layer of material comprises titanium oxide or magnesium oxide.

7. A method of preparing a sintering mix, the method comprising:
   preparing a first coated powder characterized by a first core-shell structure, wherein the first core-shell structure comprises an aluminum nitride core and a first shell comprising a rare earth oxide or a transition metal oxide and a second shell comprising a rare earth oxide or a transition metal oxide, wherein the second shell comprises a different material than the first shell;
   preparing a second coated powder characterized by a second core-shell structure, the second coated powder being different from the first coated powder, wherein the second core-shell structure comprises an aluminum nitride core and at least one shell comprising a rare earth oxide or a transition metal oxide, and wherein preparing the first coated powder or the second coated powder comprises:
      introducing hydrogen into a processing chamber, a powder disposed within a processing region of the processing chamber;
      striking a first plasma in the processing region, the first plasma comprising energetic hydrogen species;
      exposing the powder to the energetic hydrogen species in the processing region;
      chemically reducing the powder through a reaction of the powder with the energetic hydrogen species;
      removing process effluents including unreacted hydrogen from the processing region; and
      forming a layer of material on grains of the powder within the processing region; and
   blending a sintering mix comprising the first coated powder and the second coated powder.

8. The method of claim 7, wherein forming the layer of material comprises:
   exposing the powder to plasma effluents of a first precursor;
   evacuating the processing region; and
   exposing the powder to plasma effluents of a second precursor, wherein the layer of material comprises reaction products of the plasma effluents of the first precursor and the plasma effluents of the second precursor.

9. The method of claim 7, wherein:
   the at least one shell of the first core-shell structure comprises yttrium oxide; and
   the at least one shell of the second core-shell structure comprises titanium oxide or magnesium oxide.

10. The method of claim 7, wherein the at least one shell of the first coated powder and the second coated powder comprises yttrium oxide, cerium oxide, titanium oxide, calcium oxide, or magnesium oxide.

11. The method of claim 7, wherein:
a first layer of the at least one shell of the first coated powder comprises yttrium oxide; and
a second layer of the at least one shell of the first coated powder comprises titanium oxide or magnesium oxide.

* * * * *